US012463609B2

(12) United States Patent
Sedighi (10) Patent No.: US 12,463,609 B2
(45) Date of Patent: Nov. 4, 2025

(54) DYNAMIC AMPLIFIER WITH REDUCED SENSITIVITY (71) Applicant: QUALCOMM Incorporated, San Diego, CA (US)

(72) Inventor: Behnam Sedighi, La Jolla, CA (US)

(73) Assignee: QUALCOMM Incorporated, San Diego, CA (US)

( * ) Notice: Subject to any disclaimer, the term of this patent is extended or adjusted under 35 U.S.C. 154(b) by 574 days.

(21) Appl. No.: 17/821,115

(22) Filed: Aug. 19, 2022

(65) Prior Publication Data
US 2024/0063765 A1 Feb. 22, 2024

(51) Int. Cl.
H03F 3/45 (2006.01)
H03M 1/12 (2006.01)

(52) U.S. Cl.
CPC ..... *H03F 3/45183* (2013.01); *H03F 3/45475* (2013.01); *H03M 1/122* (2013.01)

(58) Field of Classification Search
CPC ............. H03F 3/45183; H03F 3/45475; H03F 3/45188; H03F 3/72; H03F 3/45654; H03F 2203/45311; H03F 2203/45318; H03F 2203/45396; H03F 2203/45631; H03F 2203/45644; H03F 2203/45371; H03M 1/122; H03M 1/16; H03G 1/0029
USPC .................................. 330/252–261
See application file for complete search history.

(56) References Cited

U.S. PATENT DOCUMENTS

| 7,095,281 | B2 | 8/2006 | Zipper et al. |
| 8,736,370 | B2 | 5/2014 | Chiu |
| 2022/0158648 | A1* | 5/2022 | Huang .................. H03M 1/122 |

OTHER PUBLICATIONS

Fan Q., et al., "A Time-Interleaved SAR ADC with Bypass-Based Opportunistic Adaptive Calibration", IEEE Journal of Solid-state Circuits, IEEE, USA, vol. 55, No. 8, Apr. 28, 2020, pp. 2082-2093, XP011799869, Section II.C, figure 13.
International Search Report and Written Opinion—PCT/US2023/071674—ISA/EPO—Nov. 28, 2023.

* cited by examiner

*Primary Examiner* — Andrea Lindgren Baltzell
*Assistant Examiner* — Nareh Shamiryan
(74) *Attorney, Agent, or Firm* — Patterson + Sheridan, L.L.P.

(57) ABSTRACT

Techniques and apparatus for reducing sensitivity (e.g., less gain variation due to parasitic capacitance) in dynamic amplifiers. One example dynamic amplifier generally includes a pair of differential input transistors, a pair of cross-coupled switches coupled between the pair of differential input transistors and a pair of differential output nodes for the dynamic amplifier, a first pair of switches coupled between the pair of differential input transistors and the pair of differential output nodes, and a second pair of switches coupled between the pair of differential input transistors and the pair of differential output nodes.

20 Claims, 4 Drawing Sheets

AMPLIFY WITH A DYNAMIC AMPLIFIER COMPRISING A PAIR OF DIFFERENTIAL INPUT NODES COMPRISING A FIRST INPUT NODE AND A SECOND INPUT NODE; A PAIR OF DIFFERENTIAL OUTPUT NODES COMPRISING A FIRST OUTPUT NODE AND A SECOND OUTPUT NODE; A FIRST DIFFERENTIAL INPUT TRANSISTOR HAVING A GATE COUPLED TO THE FIRST INPUT NODE AND HAVING A DRAIN COUPLED TO A FIRST INTERMEDIATE NODE; A SECOND DIFFERENTIAL INPUT TRANSISTOR HAVING A GATE COUPLED TO THE SECOND INPUT NODE AND HAVING A DRAIN COUPLED TO A SECOND INTERMEDIATE NODE; A FIRST SWITCH COUPLED BETWEEN THE FIRST INTERMEDIATE NODE AND THE FIRST OUTPUT NODE; A SECOND SWITCH COUPLED BETWEEN THE SECOND INTERMEDIATE NODE AND THE SECOND OUTPUT NODE; A THIRD SWITCH COUPLED BETWEEN THE FIRST INTERMEDIATE NODE AND THE SECOND OUTPUT NODE; A FOURTH SWITCH COUPLED BETWEEN THE SECOND INTERMEDIATE NODE AND THE FIRST OUTPUT NODE; A FIFTH SWITCH COUPLED BETWEEN THE FIRST INTERMEDIATE NODE AND THE SECOND OUTPUT NODE; AND A SIXTH SWITCH COUPLED BETWEEN THE SECOND INTERMEDIATE NODE AND THE FIRST OUTPUT NODE

402

CHARGE A COMMON-SOURCE NODE OF THE FIRST DIFFERENTIAL INPUT TRANSISTOR AND THE SECOND DIFFERENTIAL INPUT TRANSISTOR DURING A FIRST PHASE BY CLOSING THE FIRST SWITCH, THE SECOND SWITCH, THE THIRD SWITCH, AND THE FOURTH SWITCH, WHEREIN THE FIFTH SWITCH AND THE SIXTH SWITCH ARE OPEN

404

AMPLIFY A VOLTAGE DIFFERENCE BETWEEN A FIRST INPUT SIGNAL AT THE FIRST INPUT NODE AND A SECOND INPUT SIGNAL AT THE SECOND INPUT NODE, DURING A SECOND PHASE SUBSEQUENT TO THE FIRST PHASE, BY OPENING THE FIRST SWITCH AND THE SECOND SWITCH AND CLOSING THE FIFTH SWITCH AND THE SIXTH SWITCH, WHEREIN THE THIRD SWITCH AND THE FOURTH SWITCH ARE CLOSED DURING THE SECOND PHASE

FIG. 4

DYNAMIC AMPLIFIER WITH REDUCED SENSITIVITY

FIELD OF THE DISCLOSURE

Certain aspects of the present disclosure generally relate to electronic components and, more particularly, to dynamic amplifiers.

BACKGROUND

Electronic devices include computing devices such as desktop computers, notebook computers, tablet computers, smartphones, wearable devices like a smartwatch, Internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast, and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems (e.g., a Long Term Evolution (LTE) system or a New Radio (NR) system).

Wireless devices in these and other communication systems may include one or more analog-to-digital converters (ADCs), for converting received, amplified, filtered, and downconverted analog signals to digital signals for additional signal processing in the digital domain, for example. Several types of ADCs are available, some more suitable for particular applications than others. For example, a successive approximation register (SAR) ADC may provide an area and power-efficient architecture for low-to-medium accuracy analog-to-digital conversion applications. A SAR ADC may use a digital-to-analog converter (DAC) and a comparator to approximate a digital value corresponding to an analog input. Another type of ADC referred to as a flash ADC may provide a faster conversion speed at the cost of an exponential increase in power and area consumption compared to a SAR ADC. Another type of ADC with faster sampling rates than SAR ADCs, but lower power and area consumption than flash ADCs is referred to as a pipelined ADC.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide the advantages described herein.

Certain aspects of the present disclosure generally relate to dynamic amplifiers with reduced sensitivity to circuit non-idealities (e.g., decreased gain variation due to parasitic capacitance) and to analog-to-digital converters (ADCs) and other circuits implemented with such dynamic amplifiers.

Certain aspects of the present disclosure provide a dynamic amplifier. The dynamic amplifier generally includes a pair of differential input nodes comprising a first input node and a second input node; a pair of differential output nodes comprising a first output node and a second output node; a first differential input transistor having a gate coupled to the first input node and having a drain coupled to a first intermediate node; and a second differential input transistor having a gate coupled to the second input node and having a drain coupled to a second intermediate node. The dynamic amplifier also generally includes a first switch coupled between the first intermediate node and the first output node; a second switch coupled between the second intermediate node and the second output node; a third switch coupled between the first intermediate node and the second output node; a fourth switch coupled between the second intermediate node and the first output node; a fifth switch coupled between the first intermediate node and the second output node; and a sixth switch coupled between the second intermediate node and the first output node.

Certain aspects of the present disclosure provide a method of amplifying with a dynamic amplifier. The dynamic amplifier generally includes: a pair of differential input nodes comprising a first input node and a second input node; a pair of differential output nodes comprising a first output node and a second output node; a first differential input transistor having a gate coupled to the first input node and having a drain coupled to a first intermediate node; a second differential input transistor having a gate coupled to the second input node and having a drain coupled to a second intermediate node; a first switch coupled between the first intermediate node and the first output node; a second switch coupled between the second intermediate node and the second output node; a third switch coupled between the first intermediate node and the second output node; a fourth switch coupled between the second intermediate node and the first output node; a fifth switch coupled between the first intermediate node and the second output node; and a sixth switch coupled between the second intermediate node and the first output node. The method generally includes charging a common-source node of the first differential input transistor and the second differential input transistor during a first phase, the charging including closing the first switch, the second switch, the third switch, and the fourth switch, wherein the fifth switch and the sixth switch are open; and amplifying a voltage difference between a first input signal at the first input node and a second input signal at the second input node, during a second phase subsequent to the first phase, the amplifying including opening the first switch and the second switch and closing the fifth switch and the sixth switch, wherein the third switch and the fourth switch are closed during the second phase.

Certain aspects of the present disclosure provide a dynamic amplifier. The dynamic amplifier generally includes a pair of differential input transistors, a pair of cross-coupled switches coupled between the pair of differential input transistors and a pair of differential output nodes for the dynamic amplifier, a first pair of switches coupled between the pair of differential input transistors and the pair of differential output nodes, and a second pair of switches coupled between the pair of differential input transistors and the pair of differential output nodes.

Certain aspects of the present disclosure provide an ADC. The ADC generally includes the dynamic amplifier described herein and a conversion stage configured to generate a digital output and a residue voltage, wherein the dynamic amplifier is coupled to the conversion stage and is configured to amplify the residue voltage.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure generally relate to dynamic amplifiers with reduced sensitivity to circuit non-idealities, and to analog-to-digital converters (ADCs) and other circuits implemented with such dynamic amplifiers. For example, certain aspects provide a dynamic amplifier with reduced gain variation due to parasitic capacitance.

During amplification in some dynamic amplifiers, such parasitic capacitance may take charge from the output load capacitance, thereby altering the gain (and reducing the linearity) of the dynamic amplifier. By introducing multiple parallel cascode switches—one differential pair with a cross-coupled configuration—into a dynamic amplifier and charging the parasitic capacitance for a short period prior to amplification, the parasitic capacitance may be effectively precharged and take no (or at least less) charge from the output load capacitance during amplification. As a result, such dynamic amplifiers may have reduced sensitivity to parasitic capacitance and thus offer reduced gain variation, which may enhance the performance of ADCs and other circuits employing such a dynamic amplifier. With the cross-coupled configuration, this solution has no significant impact on the differential output of the dynamic amplifier.

Example Pipelined Analog-To-Digital Converter with Dynamic Amplifier

A pipelined ADC may be used for high performance analog-to-digital conversion in a device, such as in a receive chain of a transceiver in a 5$^{th}$ generation (5G) (or other radio access technology) wireless device. The pipelined ADC may be used, for example, with sampling rates from a few megasamples per second (Msps) to 1000 Msps+.

Figure 1:
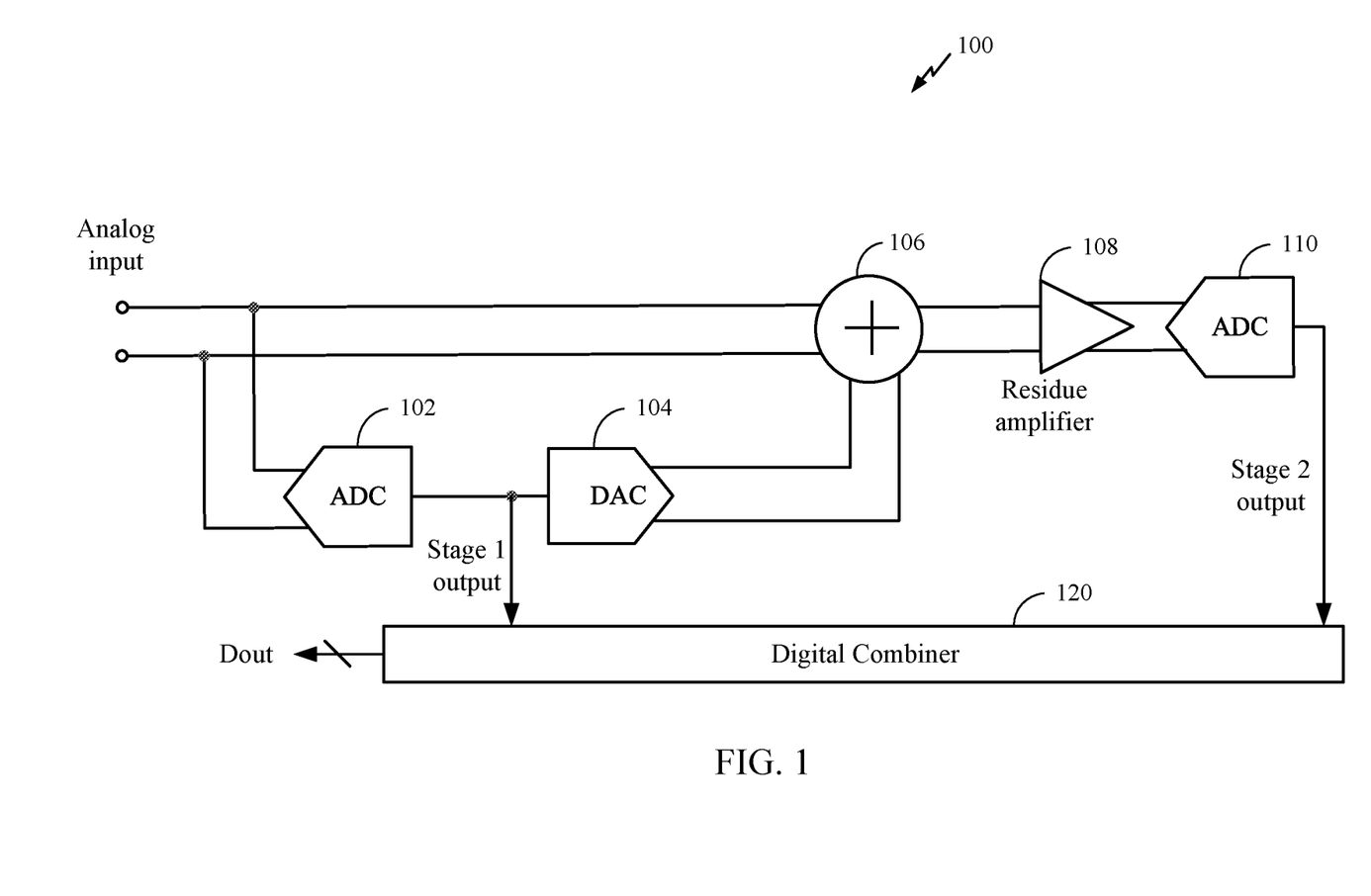
FIG. 1 is a block diagram of an example pipelined analog-to-digital converter (ADC), in which aspects of the present disclosure may be practiced.

FIG. 1 illustrates an example pipelined ADC 100, in which aspects of the present disclosure may be practiced. The pipelined ADC 100 includes at least an ADC 102 (e.g., a first ADC), a digital-to-analog converter (DAC) 104, an analog combiner 106, a residue amplifier 108, and an ADC 110 (e.g., a second ADC). Although the pipelined ADC 100 includes a single stage for generating a digital output and a digital residue, the reader is to understand that the pipelined ADC may include more than one stage, where the analog residue from one stage is input as an analog input to the next stage. In this case, the residue amplifier 108 may also be referred to as an "interstage amplifier." The pipelined ADC 100 may also include a digital combiner 120 for combining the output(s) of the one or more stages and the digital residue from the ADC 110 and generating the digital output (labeled "Dout"). Although illustrated as a differential pipelined ADC, the ADC 100 may alternatively be implemented as a single-ended pipelined ADC.

The ADC 102 and the DAC 104 may compose a conversion stage of the pipelined ADC 100 that is configured to generate a digital output and a residue voltage. The ADC 102 has inputs coupled to a differential input pair (e.g., input nodes) and receives an analog input (e.g., a differential input voltage signal). The ADC 102 may be a relatively low-resolution ADC and may be implemented by a flash ADC or any other suitable type of ADC. The ADC 102 generates a digital output (e.g., a stage 1 output, which may be single-ended) based on the analog input. Having an input coupled to an output of the ADC 102, the DAC 104 receives the digital output of the ADC 102 as an input. The DAC 104 regenerates the received digital input from the ADC 102 into an analog voltage (a differential voltage) on another differential pair.

The analog combiner 106 has first inputs coupled to the differential input pair and to the differential outputs of the DAC 104. The analog combiner 106 outputs a residual voltage (also referred to as the "residue") based on a difference between the analog input and the analog voltage from the DAC 104.

As illustrated, the residue amplifier 108 has inputs coupled to the conversion stage via the outputs of the analog combiner 106 and is configured to receive the residual voltage as an input from the analog combiner 106. For certain aspects, the residue amplifier 108 may be implemented as a dynamic amplifier circuit (with a dynamic amplifier), as described below. The residue amplifier 108 amplifies the residual voltage according to a gain of the residue amplifier. The ADC 110 has inputs coupled to outputs of the residue amplifier 108 and receives the output voltage from the residue amplifier 108 as an input. The ADC 110 may be implemented as a successive-approximation register (SAR) ADC, a flash ADC, or any other suitable type of ADC. The ADC 110 generates a digital output (e.g., the digitized residue, but labeled here as a stage 2 output) based on the received output voltage from the residue amplifier 108.

While the residue amplifier 108 is important to the performance of the pipelined ADC, some implementations of the residue amplifier 108 may use a substantial amount of power for amplifying the residual voltage. Dynamic amplifiers are relatively very power efficient, and therefore, a dynamic amplifier may be utilized as the residue amplifier 108 in the pipelined ADC 100.

While FIG. 1 provides a pipelined ADC as an example application in which certain aspects of the present disclosure may be implemented to facilitate understanding, certain aspects described herein may be used for amplification and/or analog-to-digital conversion in any of various other suitable systems. For example, the dynamic amplifier described herein may be used in any circuit involving analog multiplication where the output is a capacitance (e.g., has a capacitive component), such as a switched-capacitor filter, a class-H audio amplifier, a delta-sigma converter, or a mixer (e.g., an RF mixer).

Example Dynamic Amplifier

Figure 2A:
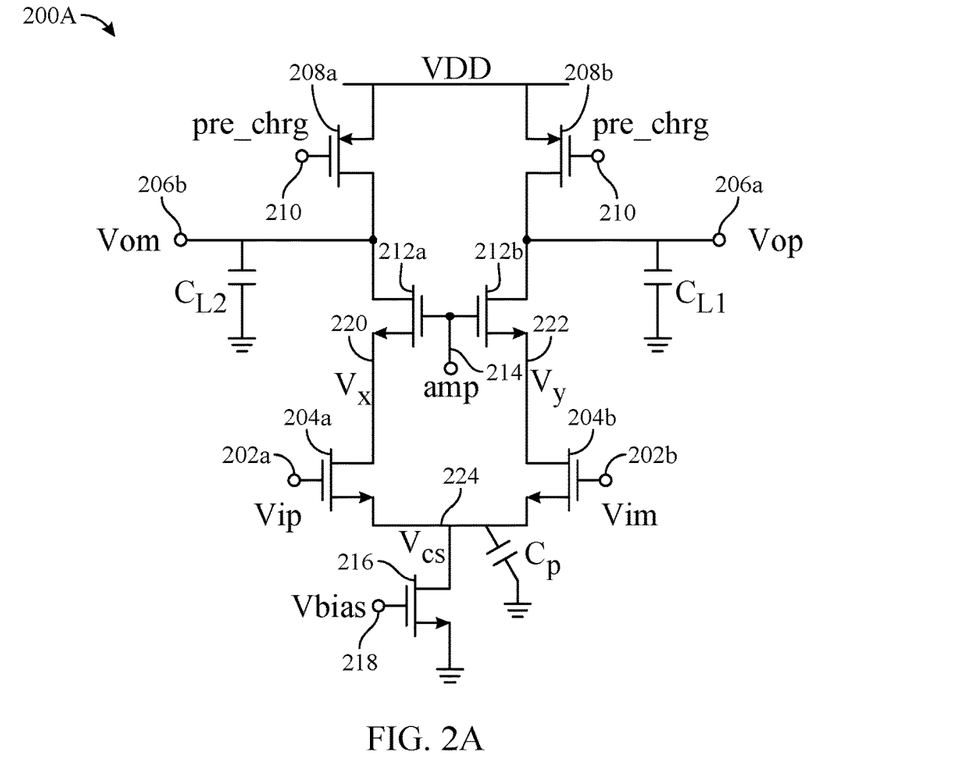
FIG. 2A is a circuit diagram of an example dynamic amplifier, in which aspects of the present disclosure may be practiced.

FIG. 2A is a circuit diagram of an example dynamic amplifier 200A, in which aspects of the present disclosure may be practiced. The dynamic amplifier 200A may be used, for example, as a residue amplifier (e.g., the residue amplifier 108) in a pipelined analog-to-digital converter (ADC) (e.g., the pipelined ADC 100 of FIG. 1).

As illustrated, the dynamic amplifier 200A has a pair of differential input nodes 202a and 202b (collectively referred to herein as "differential input nodes 202") coupled to gates of a first differential input transistor 204a and a second differential input transistor 204b (collectively referred to herein as "differential input transistors 204"). Differential input voltages (labeled "Vip" and "Vim" for plus and minus input voltages) at the differential input nodes 202 may be input to the differential input transistors 204. The first differential input transistor 204a may have a drain coupled to a first intermediate node 220 (having a voltage labeled "$V_x$"), and the second differential input transistor 204b may have a drain coupled to a second intermediate node 222 (having a voltage labeled "$V_y$"). Sources of the differential input transistors 204 may be coupled together at a common source node 224.

The dynamic amplifier 200A also has a pair of differential output nodes comprising a first differential output node 206a and a second differential output node 206b (collectively referred to herein as "differential output nodes 206") at which differential output voltages (labeled "Vop" and "Vom," respectively, for plus and minus output voltages) are generated by the dynamic amplifier. A first capacitive element (e.g., a load capacitor labeled "$C_{L1}$") may be coupled between the first differential output node 206a and a reference potential node (e.g., electrical ground) for the dynamic amplifier 200A. Similarly, a second capacitive element (e.g., a load capacitor labeled "$C_{L2}$") may be coupled between the second differential output node 206b and the reference potential node. While the capacitive elements may be referred to as capacitors $C_{L1}$ and $C_{L2}$, $C_{L1}$ and $C_{L2}$ may also refer to the respective capacitances of the capacitive elements.

The dynamic amplifier 200A may also include a first pre-charge switch 208a and a second pre-charge switch 208b (collectively referred to herein as "pre-charge switches 208"). As shown, the first pre-charge switch 208a may be coupled between a power supply rail (labeled "VDD") and the second differential output node 206b, and the second pre-charge switch 208b may be coupled between the power supply rail and the first differential output node 206a. The pre-charge switches 208 may be implemented by transistors (e.g., p-type field-effect transistors (PFETs)), as shown. The pre-charge switches 208 may have control inputs (e.g., gates of the transistors implementing the pre-charge switches 208) coupled together at a control node 210 with a control voltage labeled "pre_chrg."

The dynamic amplifier 200A may also include a first amplification switch 212a and a second amplification switch 212b (collectively referred to herein as "amplification switches 212"). As shown, the first amplification switch 212a may be coupled between the second differential output node 206b and the first intermediate node 220, and the second amplification switch 212b may be coupled between the first differential output node 206a and the second intermediate node 222. Since the amplification switches 212 are coupled in cascode with the input transistors 204, the amplification switches 212 may be referred to as "cascode devices." The amplification switches 212 may be implemented by transistors (e.g., n-type field-effect transistors (NFETs), as shown, where drains of the transistors are coupled to a respective output node and wherein sources of the transistors are coupled to a respective intermediate node. The amplification switches 212 may have control inputs (e.g., gates of the transistors implementing the amplification switches 212) coupled together at a control node 214 with an control voltage labeled "amp."

The dynamic amplifier 200A may also include a biasing device 216 (which may be a current sink implemented by a transistor (e.g., an NFET), as shown) coupled between sources of the differential input transistors 204 and the reference potential node (e.g., electrical ground) for the dynamic amplifier. The biasing device 216 may have a control input 218 (e.g., a gate of the transistor implementing the biasing device 216) with an input voltage (e.g., a bias voltage) labeled "Vbias." The biasing device 216 may be configured, based on the voltage at the control input 218, to act as a voltage-controlled current sink to sink an amount of current from the sources of the differential input transistors 204.

Figure 2B:
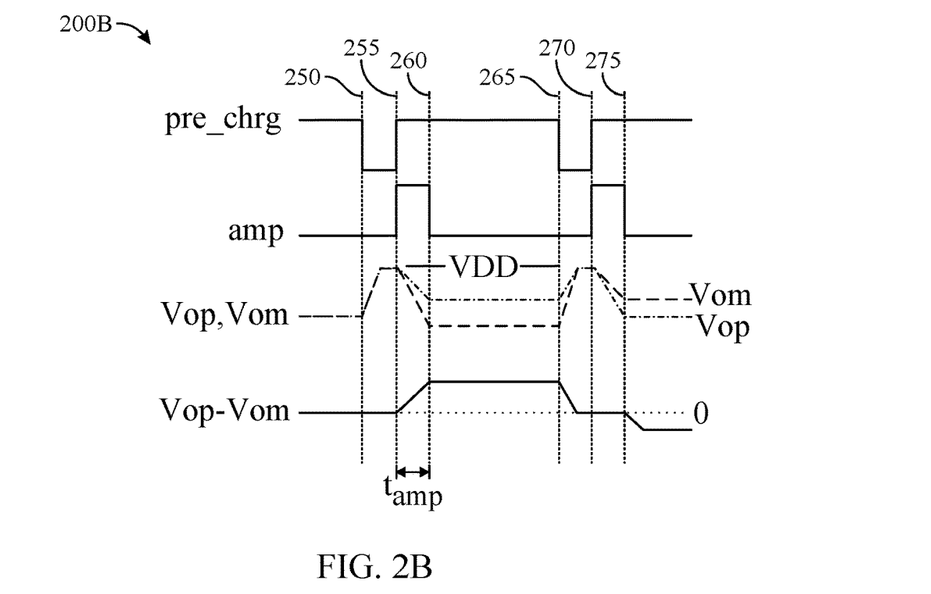
FIG. 2B is a timing diagram for the dynamic amplifier of FIG. 2A.

FIG. 2B is an example timing diagram 200B for the dynamic amplifier 200A of FIG. 2A. As illustrated, at a time 250, the control signal pre_chrg at the control node 210 transitions from logic high to logic low, such that the pre-charge switches 208 may be closed to begin a pre-charge period. By closing the pre-charge switches 208 at the time 250, the load capacitors $C_{L1}$ and $C_{L2}$ begin to charge, and the output voltages (e.g., Vop, Vom) at the differential output nodes 206 begin to increase, ideally until the output voltages are equal to the voltage of the power rail (e.g., VDD), as illustrated in the timing diagram 200B.

At a time 255, the pre_chrg signal at the control node 210 transitions from logic low to logic high (to end the pre-charge period), and the control signal "amp" at the control node 214 transitions from logic low to logic high (to start an amplification period). That is, at the time 255, the pre-charge switches 208 are opened, and the amplification switches 212 are closed. As illustrated, between the time 255 and a time 260, the output voltages Vop and Vom begin to decrease at different rates (e.g., according to the different transconductances of the input transistors 204 and the different load capacitances). Accordingly, as the output voltages decrease, the difference between the output voltages (e.g., Vop−Vom) increases with time.

At the time 260, the amp signal at the control node 214 transitions from logic high to logic low, thereby opening the amplification switches 212 and ending the amplification period for the dynamic amplifier 200A. The difference between the output voltages is an amplified version of the difference between the input voltages Vip and Vim, according to the differential gain of the dynamic amplifier. The differential gain is a function of the input transistor transconductance, the amplification period $t_{amp}$ (the time between the times 255 and 260), and the load capacitance.

Between the time 260 and a time 265, the output voltages Vop and Vom are held by the load capacitors, and the difference between the output voltages remains constant (or at least relatively constant). At the time 265, the pre_chrg signal at the control node 210 transitions from logic high to logic low, closing the pre-charge switches 208 and starting another pre-charge period. As a result, between the time 265 and a time 270, the output voltages once again increase, ideally until the output voltages are equal to the voltage VDD of the power rail, effectively resetting the output voltages before another amplification period. When reset, the difference between the output voltages is zero.

At the time 270, the pre_chrg signal at the control node 210 transitions from logic low to logic high, thereby ending the pre-charge period, and the amp signal at the control node 214 transitions from logic low to logic high, thereby starting another amplification period. That is, the pre-charge switches 208 are opened (e.g., the pre-charge transistors are turned off), and the amplification switches 212 are closed (e.g., the cascode transistors are turned on). As illustrated, between the time 270 and a time 275 (when the amp signal at the control node 214 transitions from logic high to logic low), the output voltages Vop and Vom begin to decrease at different rates, once again generating a difference between the output voltages at the time 275. The difference between the output voltages may be negative (e.g., Vom may be greater than Vop), as illustrated at the time 275.

Dynamic amplifiers (such as the dynamic amplifier 200A) generally have lower power consumption compared to some other amplifier architectures (e.g., class-A amplifiers), because the dynamic amplifier is only active during a fraction of each conversion interval. However, dynamic amplifiers may be sensitive to variations in process, voltage, and temperature (PVT) and may suffer from nonlinearities.

For example, the differential gain of the dynamic amplifier 200A may be susceptible to parasitic capacitance, where the parasitic capacitance at the common-source node 224 (represented as a capacitor labeled "$C_P$," the capacitance of which may also be referred to as $C_P$) may have the most dominating effect on the differential gain. Before amplification (e.g., before the time 255), a voltage (labeled "$V_{CS}$") at the common-source node 224 may be approximately equal to zero, but during amplification, the voltage $V_{CS}$ is approximately equal to the common-mode input voltage of the dynamic amplifier 200A minus the gate-to-source voltage ($V_{GS}$) of the differential input transistors 204. As a result, the capacitor $C_P$ typically needs to be charged at the beginning of the amplification period. Consequently, some of the current discharged from the load capacitors $C_L$ during the amplification period is absorbed by the capacitor $C_P$ to charge this parasitic capacitor. As explained above, the differential output is proportional to the differential input by the differential gain. However, the charge absorbed by the capacitor $C_P$ causes an error in this proportionality factor, leading to a gain error in the dynamic amplifier 200A. Gain error is typically undesirable in certain applications (such as a dynamic amplifier in an ADC).

Accordingly, certain aspects of the present disclosure provide a dynamic amplifier with reduced sensitivity to parasitic capacitance and decreased gain variation. The dynamic amplifier may be configured to charge the parasitic capacitance at the common-source node prior to amplification, without any significant impact on the differential output.

Figure 3A:
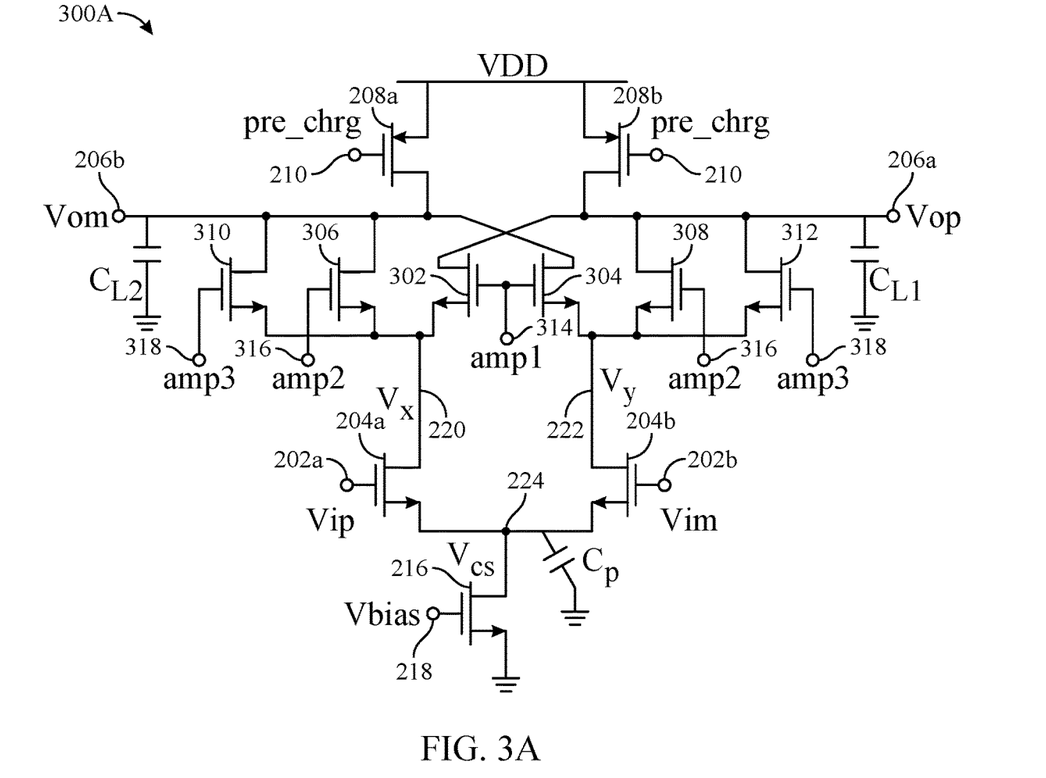
FIG. 3A is a circuit diagram of an example dynamic amplifier with multiple parallel switches including a cross-coupled switch pair, in accordance with certain aspects of the present disclosure.

FIG. 3A is a circuit diagram of an example dynamic amplifier 300A, in accordance with certain aspects of the present disclosure. The dynamic amplifier 300A may be similar to the dynamic amplifier 200A, but with additional amplification switches coupled in parallel between the differential output nodes 206 and the intermediate nodes 220 and 222. The additional amplification switches may allow the dynamic amplifier 300A to introduce a preamplification period for charging the parasitic capacitance at the common-source node 224 before the amplification period, resulting in reduced gain variation compared to the dynamic amplifier 200A, as discussed in more detail below.

The dynamic amplifier 300A generally includes a first switch 302 coupled between the first intermediate node 220 and the first differential output node 206a, and a second switch 304 coupled between the second intermediate node 222 and the second differential output node 206b. As illustrated, the first switch 302 and the second switch 304 may be a pair of cross-coupled switches coupled between the pair of differential input transistors 204 and the pair of differential output nodes 206 for the dynamic amplifier 300A. The first switch 302 and the second switch 304 may have control inputs (e.g., gates of the transistors implementing the first switch 302 and the second switch 304) coupled together at a control node 314 with a control voltage labeled "amp1."

The dynamic amplifier 300A also includes a third switch 306 coupled between the first intermediate node 220 and the second differential output node 206b, a fourth switch 308 coupled between the second intermediate node 222 and the first differential output node 206a, a fifth switch 310 coupled between the first intermediate node 220 and the second differential output node 206b, and a sixth switch 312 coupled between the second intermediate node 222 and the first differential output node 206a. In other words, the third switch 306 and the fourth switch 308 may compose a first pair of switches—and the fifth switch 310 and the sixth switch 312 may compose a second pair of switches—coupled between the pair of differential input transistors 204 and the pair of differential output nodes 206. The third switch 306 and the fourth switch 308 may have control inputs (e.g., gates of the transistors implementing the third switch 306 and the fourth switch 308) coupled together at a control node 316 with a control voltage labeled "amp2." The fifth switch 310 and the sixth switch 312 may have control inputs (e.g., gates of the transistors implementing the fifth switch 310 and the sixth switch 312) coupled together at a control node 318 with a control voltage labeled "amp3."

Figure 3B:
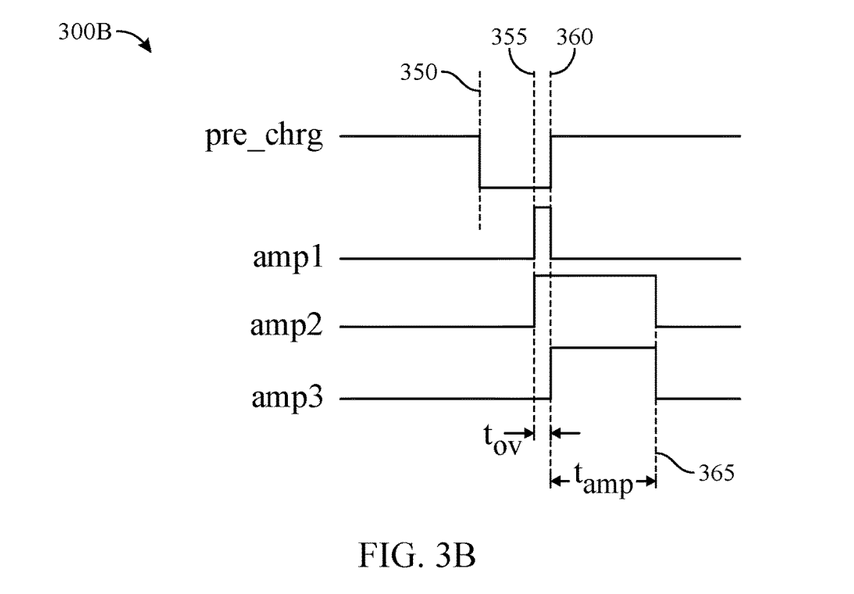
FIG. 3B is a timing diagram for the dynamic amplifier of FIG. 3A.

FIG. 3B is a timing diagram 300B for the dynamic amplifier 300A. As illustrated, at a time 350, the pre_chrg signal at the control node 210 transitions from logic high to logic low, closing the pre-charge switches 208 as explained above. Although not illustrated, at time 350, the output voltages (e.g., Vop, Vom) at the differential output nodes 206 begin to increase until the output voltages are equal to the voltage of the power rail.

At a time 355, while the pre_chrg signal at the control node 210 is still low, the amp1 signal at the control node 314 transitions from logic low to logic high, thereby closing the first switch 302 and the second switch 304 (i.e., the cross-coupled pair of switches). Additionally, at the time 355, the amp2 signal at the control node 316 may also transition from logic low to logic high, thereby closing the third switch 306 and the fourth switch 308. Between the time 355 to a time 360 (labeled "$t_{ov}$"), the current through the first, second, third, and fourth switches 302, 304, 306, and 308 may charge the parasitic capacitance at the common-source node 224 (represented by capacitor $C_p$) without affecting the differential output voltage. In some aspects, the time $t_{ov}$ may be equal to a delay of an inverter, for example.

The period of time $t_{ov}$ between the time 355 and the time 360 may be referred to herein as a "first phase" and may be considered as the preamplification period. According to certain aspects, during the first phase, the pair of cross-coupled switches (e.g., the first switch 302 and the second switch 304) and the first pair of switches (e.g., the third switch 306 and the fourth switch 308) may be configured to be closed and the second pair of switches (e.g., the fifth switch 310 and the sixth switch 312) may be configured to be open. For certain aspects, sources of the pair of differential input transistors 204 may be coupled together at the common-source node 224, and a voltage of the common-source node 224 ($V_{CS}$) is configured to rise during the first phase. Cross-coupling of the pair of cross-coupled switches may be configured to allow the voltage of the common-source node to rise during the first phase without a change in a differential output voltage across the pair of differential output nodes.

According to certain aspects, the first switch 302 and the third switch 306 may each have a transistor width equal to half a transistor width of the amplification switch 212a, and the second switch 304 and the fourth switch 308 may each have a transistor width equal to half a transistor width of the amplification switch 212b. By sizing the switches in this way, when the first switch 302, the second switch 304, the third switch 306, and the fourth switch 308 are on (e.g., between the time 355 and the time 360), a substantially equal amount of current will travel through each of the switches. The cross-coupling of the first switch 302 and the second switch 304 ensures that a differential voltage is not generated at the differential output nodes 206 while the capacitor $C_p$ is charged.

At the time 360, the pre_chrg signal at the control node 210 transitions from logic low to logic high, thereby opening the pre-charge switches 208. Additionally, at the time 360, the amp1 signal at the control node 314 transitions from logic high to logic low, thereby opening the first switch 302 and the second switch 304 (e.g., the cross-coupled pair), and the amp3 signal at the control node 318 transitions from logic low to logic high, thereby closing the fifth switch 310 and the sixth switch 312. At the time 360, the third switch 306 and the fourth switch 308 remain closed. The time 360 may be considered the time at which amplification begins.

Between the time 360 and a time 365 (labeled "$t_{amp}$" and considered the amplification period), although not illustrated, the output voltages begin to decrease at different rates. Accordingly, as the output voltages decrease, a difference between the output voltages (e.g., Vop−Vom) increases. At the time 365, the amp2 and amp3 signals at the control nodes 316 and 318, respectively, transition from logic high to logic low, thereby opening the third switch 306, the fourth switch 308, the fifth switch 310, and the sixth switch 312. Accordingly, after the time 365, the load capacitors may hold the output voltages, and the difference between the output voltages may remain constant (or at least relatively constant).

The period of time between the time 360 and the time 365 may be referred to as a "second phase" and may be considered as the amplification period. For certain aspects, during the second phase, the pair of cross-coupled switches may be configured to be open and the first pair of switches and the second pair of switches may be configured to be closed. In certain aspects, amplification of a differential input signal input to the pair of differential input transistors 204 is configured to occur during the second phase.

According to certain aspects, the third switch 306 and the fifth switch 310 may each have a transistor width equal to half a transistor width of the amplification switch 212a, and the fourth switch 308 and the sixth switch 312 may each have a width transistor equal to half a transistor width of the amplification switch 212b. By sizing the switches in this way, when the third switch 306, the fourth switch 308, the fifth switch 310 and the sixth switch 312 are all closed (e.g., during amplification between the time 360 and the time 365), the dynamic amplifier 300A may function similar to the dynamic amplifier 200A.

A period of time after the time 365 may be referred to as a "third phase." During the third phase, the pair of cross-coupled switches, the first pair of switches, and the second pair of switches may be configured to be open. After the third phase, the dynamic amplifier 300A may enter a fourth phase, which may be another precharging period (similar to the period between the time 350 and the time 355).

The introduction of the multiple cascode devices (the switches 302, 304, 306, 308, 310, and 312) in parallel and the preamplification period provides a switching scheme for a dynamic amplifier that allows for precharging the parasitic capacitance at the common-source node 224 before amplification, such that the amount of differential charge taken from the load capacitors $C_L$ during amplification is significantly decreased, thereby reducing the sensitivity to this parasitic capacitance and, hence, the gain error of the dynamic amplifier. The cross-coupled pair of switches prevents impact to the differential output from this preamplification period.

Example Amplification Operations

Figure 4:
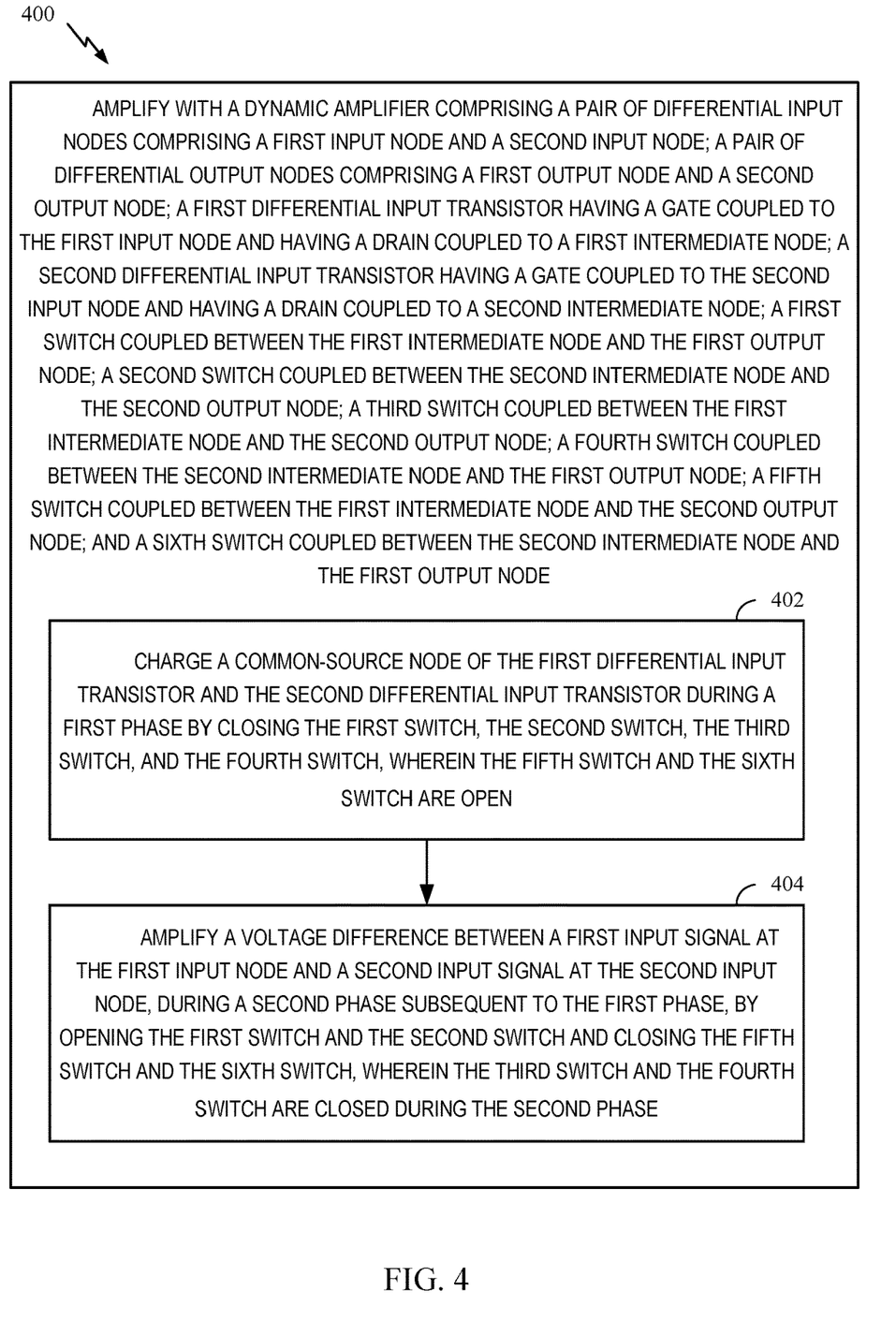
FIG. 4 is a flow diagram depicting example operations for amplifying with a dynamic amplifier, in accordance with certain aspects of the present disclosure.

FIG. 4 is a flow diagram depicting example operations 400 for amplifying with a dynamic amplifier (e.g., the dynamic amplifier 300A), in accordance with aspects of the present disclosure. The dynamic amplifier may include a pair of differential input nodes comprising a first input node (e.g., node 202a) and a second input node (e.g., node 202b); a pair of differential output nodes comprising a first output node (e.g., node 206a) and a second output node (e.g., node 206b); a first differential input transistor (e.g., transistor 204a) having a gate coupled to the first input node and having a drain coupled to a first intermediate node (e.g., node 220); a second differential input transistor (e.g., transistor 204b) having a gate coupled to the second input node and having a drain coupled to a second intermediate node (e.g., node 222); a first switch (e.g., switch 302) coupled between the first intermediate node and the first output node; a second switch (e.g., switch 304) coupled between the second intermediate node and the second output node; a third switch (e.g., switch 306) coupled between the first intermediate node and the second output node; a fourth switch (e.g., switch 308) coupled between the second intermediate node and the first output node; a fifth switch (e.g., switch 310) coupled between the first intermediate node and the second output node; and a sixth switch (e.g., switch 312) coupled between the second intermediate node and the first output node.

The operations 400 may begin, at block 402, by charging a common-source node (e.g., node 224) of the first differential input transistor and the second differential input transistor during a first phase (e.g., the preamplification period to, between the time 355 and the time 360) (or more accurately, allowing the common-source node to be charged during the first phase). Allowing the common-source node to be charged at block 402 may include closing the first switch, the second switch, the third switch, and the fourth switch, wherein the fifth switch and the sixth switch are open.

At block 404, the dynamic amplifier may amplify a voltage difference between a first input signal (e.g., Vip signal) at the first input node and a second input signal (e.g., Vim signal) at the second input node, during a second phase (e.g., the amplification period $t_{amp}$ between the time 360 and the time 365) subsequent to the first phase. The amplifying at block 404 may include opening the first switch and the second switch and closing the fifth switch and the sixth switch. The third switch and the fourth switch may be closed during the second phase.

According to certain aspects, the operations 400 may further involve resetting the dynamic amplifier, during a third phase (e.g., after the time 365) subsequent to the second phase. The resetting may include opening the third switch, the fourth switch, the fifth switch, and the sixth switch. The first switch and the second switch may be open during the third phase.

According to certain aspects, a voltage of the common-source node (e.g., $V_{CS}$) may rise during the first phase without a change in a differential output voltage (e.g., Vop−Vom) across the pair of differential output nodes due to a cross-coupling of the first switch and the second switch compared to the third switch and the fourth switch.

Example Aspects

Implementation examples are described in the following numbered aspects:

Aspect 1: A dynamic amplifier comprising: a pair of differential input nodes comprising a first input node and a second input node; a pair of differential output nodes comprising a first output node and a second output node; a first differential input transistor having a gate coupled to the first input node and having a drain coupled to a first intermediate node; a second differential input transistor having a gate coupled to the second input node and having a drain coupled to a second intermediate node; a first switch coupled between the first intermediate node and the first output node; a second switch coupled between the second intermediate node and the second output node; a third switch coupled between the first intermediate node and the second output node; a fourth switch coupled between the second intermediate node and the first output node; a fifth switch coupled between the first intermediate node and the second output node; and a sixth switch coupled between the second intermediate node and the first output node.

Aspect 2: The dynamic amplifier of Aspect 1, wherein: a control input of the first switch is coupled to a control input of the second switch, a control input of the third switch is coupled to a control input of the fourth switch, and a control input of the fifth switch is coupled to a control input of the sixth switch.

Aspect 3: The dynamic amplifier of Aspect 1 or 2, wherein: for a first phase, the first switch, the second switch, the third switch, and the fourth switch are configured to be closed and the fifth switch and the sixth switch are configured to be open; and for a second phase subsequent to the first phase, the first switch and the second switch are configured to be open and the third switch, the fourth switch, the fifth switch, and the sixth switch are configured to be closed.

Aspect 4: The dynamic amplifier of Aspect 3, wherein: a source of the first differential input transistor is coupled to a source of the second differential input transistor at a common-source node; and a voltage of the common-source node is configured to rise during the first phase.

Aspect 5: The dynamic amplifier of Aspect 4, wherein: a cross-coupling of the first switch and the second switch compared to the third switch and the fourth switch is configured to allow the voltage of the common-source node to rise during the first phase without a change in a differential output voltage across the pair of differential output nodes; and amplification of a differential input signal across the pair of differential input nodes is configured to occur during the second phase.

Aspect 6: The dynamic amplifier of any of Aspects 3-5, wherein for a third phase subsequent to the second phase, the first switch, the second switch, the third switch, the fourth switch, the fifth switch, and the sixth switch are configured to be open.

Aspect 7: The dynamic amplifier of any of the preceding Aspects, wherein: the first switch and the second switch are implemented by a first pair of transistors, the third switch and the fourth switch are implemented by a second pair of transistors, and the first pair of transistors has a same transistor size as the second pair of transistors.

Aspect 8: The dynamic amplifier of any of the preceding Aspects, further comprising: a seventh switch coupled between the second output node and a power supply rail; an eighth switch coupled between the first output node and the power supply rail, wherein a control input of the seventh switch is coupled to a control input of the eighth switch; and a current sink coupled between a source of the first differential input transistor and a reference potential node, wherein the source of the first differential input transistor is coupled to a source of the second differential input transistor.

Aspect 9: The dynamic amplifier of Aspect 8, wherein: for a first phase, the first switch, the second switch, the third switch, the fourth switch, the fifth switch, and the sixth switch are configured to be open; for a second phase subsequent to the first phase, the first switch, the second switch, the third switch, and the fourth switch are configured to be closed and the fifth switch and the sixth switch are configured to be open; and for a third phase subsequent to the second phase, the first switch and the second switch are configured to be open and the third switch, the fourth switch, the fifth switch, and the sixth switch are configured to be closed.

Aspect 10: The dynamic amplifier of Aspect 9, wherein: for the first phase, the seventh switch and the eighth switch are configured to be closed; for the second phase, the seventh switch and the eighth switch are configured to be closed; and for the third phase, the seventh switch and the eighth switch are configured to be open.

Aspect 11: An analog-to-digital converter (ADC) comprising the dynamic amplifier of any of the preceding Aspects, the ADC further comprising a conversion stage configured to generate a digital output and a residue voltage, wherein the dynamic amplifier is coupled to the conversion stage and is configured to amplify the residue voltage.

Aspect 12: A method of amplifying with a dynamic amplifier comprising: a pair of differential input nodes comprising a first input node and a second input node; a pair of differential output nodes comprising a first output node and a second output node; a first differential input transistor having a gate coupled to the first input node and having a drain coupled to a first intermediate node; a second differential input transistor having a gate coupled to the second input node and having a drain coupled to a second intermediate node; a first switch coupled between the first intermediate node and the first output node; a second switch coupled between the second intermediate node and the second output node; a third switch coupled between the first intermediate node and the second output node; a fourth switch coupled between the second intermediate node and the first output node; a fifth switch coupled between the first intermediate node and the second output node; and a sixth switch coupled between the second intermediate node and the first output node, the method comprising: charging a common-source node of the first differential input transistor and the second differential input transistor during a first phase, the charging including closing the first switch, the second switch, the third switch, and the fourth switch, wherein the fifth switch and the sixth switch are open; and amplifying a voltage difference between a first input signal at the first input node and a second input signal at the second input node, during a second phase subsequent to the first phase, the amplifying including opening the first switch and the second switch and closing the fifth switch and the sixth switch, wherein the third switch and the fourth switch are closed during the second phase.

Aspect 13: The method of Aspect 12, further comprising resetting the dynamic amplifier, during a third phase subsequent to the second phase, the resetting including opening the third switch, the fourth switch, the fifth switch, and the sixth switch, wherein the first switch and the second switch are open during the third phase.

Aspect 14: The method of Aspect 12 or 13, wherein a voltage of the common-source node rises during the first phase without a change in a differential output voltage across the pair of differential output nodes due to a cross-coupling of the first switch and the second switch compared to the third switch and the fourth switch.

Aspect 15: A dynamic amplifier comprising: a pair of differential input transistors; a pair of cross-coupled switches coupled between the pair of differential input transistors and a pair of differential output nodes for the dynamic amplifier; a first pair of switches coupled between the pair of differential input transistors and the pair of differential output nodes; and a second pair of switches coupled between the pair of differential input transistors and the pair of differential output nodes.

Aspect 16: The dynamic amplifier of Aspect 15, wherein: for a first phase, the pair of cross-coupled switches and the first pair of switches are configured to be closed and the second pair of switches are configured to be open; and for a second phase subsequent to the first phase, the pair of cross-coupled switches are configured to be open and the first pair of switches and the second pair of switches are configured to be closed.

Aspect 17: The dynamic amplifier of Aspect 16, wherein: sources of the pair of differential input transistors are coupled together at a common-source node; and a voltage of the common-source node is configured to rise during the first phase.

Aspect 18: The dynamic amplifier of Aspect 16 or 17, wherein: a cross-coupling of the pair of cross-coupled switches is configured to allow the voltage of the common-source node to rise during the first phase without a change in a differential output voltage across the pair of differential output nodes; and amplification of a differential input signal input to the pair of differential input transistors is configured to occur during the second phase.

Aspect 19: The dynamic amplifier of any of Aspects 16 to 18, wherein for a third phase subsequent to the second phase, the pair of cross-coupled switches, the first pair of switches, and the second pair of switches are configured to be open.

Aspect 20: An analog-to-digital converter (ADC) comprising the dynamic amplifier of any of Aspects 15 to 20, the ADC further comprising a conversion stage configured to generate a digital output and a residue voltage, wherein the dynamic amplifier is coupled to the conversion stage and is configured to amplify the residue voltage.

Additional Considerations

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A dynamic amplifier comprising:
a pair of differential input nodes comprising a first input node and a second input node;
a pair of differential output nodes comprising a first output node and a second output node;
a first differential input transistor having a gate coupled to the first input node and having a drain coupled to a first intermediate node;
a second differential input transistor having a gate coupled to the second input node and having a drain coupled to a second intermediate node;
a first switch coupled between the first intermediate node and the first output node;
a second switch coupled between the second intermediate node and the second output node;
a third switch coupled between the first intermediate node and the second output node;
a fourth switch coupled between the second intermediate node and the first output node;
a fifth switch coupled between the first intermediate node and the second output node; and
a sixth switch coupled between the second intermediate node and the first output node, wherein:
for a first phase, the first switch, the second switch, the third switch, and the fourth switch are configured to be closed and the fifth switch and the sixth switch are configured to be open; and
for a second phase subsequent to the first phase, the first switch and the second switch are configured to be open and the third switch, the fourth switch, the fifth switch, and the sixth switch are configured to be closed.

2. The dynamic amplifier of claim 1, wherein:
a control input of the first switch is coupled to a control input of the second switch;
a control input of the third switch is coupled to a control input of the fourth switch; and
a control input of the fifth switch is coupled to a control input of the sixth switch.

3. The dynamic amplifier of claim 1, wherein:
a source of the first differential input transistor is coupled to a source of the second differential input transistor at a common-source node; and
a voltage of the common-source node is configured to rise during the first phase.

4. The dynamic amplifier of claim 3, wherein:
a cross-coupling of the first switch and the second switch compared to the third switch and the fourth switch is configured to allow the voltage of the common-source node to rise during the first phase without a change in a differential output voltage across the pair of differential output nodes; and
amplification of a differential input signal across the pair of differential input nodes is configured to occur during the second phase.

5. The dynamic amplifier of claim 1, wherein for a third phase subsequent to the second phase, the first switch, the second switch, the third switch, the fourth switch, the fifth switch, and the sixth switch are configured to be open.

6. The dynamic amplifier of claim 1, wherein:
the first switch and the second switch are implemented by a first pair of transistors;
the third switch and the fourth switch are implemented by a second pair of transistors; and
the first pair of transistors has a same transistor size as the second pair of transistors.

7. A dynamic amplifier comprising:
a pair of differential input nodes comprising a first input node and a second input node;
a pair of differential output nodes comprising a first output node and a second output node;
a first differential input transistor having a gate coupled to the first input node and having a drain coupled to a first intermediate node;
a second differential input transistor having a gate coupled to the second input node and having a drain coupled to a second intermediate node;
a first switch coupled between the first intermediate node and the first output node;
a second switch coupled between the second intermediate node and the second output node;
a third switch coupled between the first intermediate node and the second output node;
a fourth switch coupled between the second intermediate node and the first output node;
a fifth switch coupled between the first intermediate node and the second output node;
a sixth switch coupled between the second intermediate node and the first output node;
a seventh switch coupled between the second output node and a power supply rail;
an eighth switch coupled between the first output node and the power supply rail, wherein a control input of the seventh switch is coupled to a control input of the eighth switch; and
a current sink coupled between a source of the first differential input transistor and a reference potential node, wherein the source of the first differential input transistor is coupled to a source of the second differential input transistor.

8. The dynamic amplifier of claim 7, wherein:
for a first phase, the first switch, the second switch, the third switch, the fourth switch, the fifth switch, and the sixth switch are configured to be open;

for a second phase subsequent to the first phase, the first switch, the second switch, the third switch, and the fourth switch are configured to be closed and the fifth switch and the sixth switch are configured to be open; and for a third phase subsequent to the second phase, the first switch and the second switch are configured to be open and the third switch, the fourth switch, the fifth switch, and the sixth switch are configured to be closed.

9. The dynamic amplifier of claim 8, wherein:
for the first phase, the seventh switch and the eighth switch are configured to be closed;
for the second phase, the seventh switch and the eighth switch are configured to be closed; and
for the third phase, the seventh switch and the eighth switch are configured to be open.

10. An analog-to-digital converter (ADC) comprising the dynamic amplifier of claim 1, the ADC further comprising a conversion stage configured to generate a digital output and a residue voltage, wherein the dynamic amplifier is coupled to the conversion stage and is configured to amplify the residue voltage.

11. A method of amplifying with a dynamic amplifier comprising:
a pair of differential input nodes comprising a first input node and a second input node;
a pair of differential output nodes comprising a first output node and a second output node;
a first differential input transistor having a gate coupled to the first input node and having a drain coupled to a first intermediate node;
a second differential input transistor having a gate coupled to the second input node and having a drain coupled to a second intermediate node;
a first switch coupled between the first intermediate node and the first output node;
a second switch coupled between the second intermediate node and the second output node;
a third switch coupled between the first intermediate node and the second output node;
a fourth switch coupled between the second intermediate node and the first output node;
a fifth switch coupled between the first intermediate node and the second output node; and
a sixth switch coupled between the second intermediate node and the first output node, the method comprising:
charging a common-source node of the first differential input transistor and the second differential input transistor during a first phase, the charging including closing the first switch, the second switch, the third switch, and the fourth switch, wherein the fifth switch and the sixth switch are open; and
amplifying a voltage difference between a first input signal at the first input node and a second input signal at the second input node, during a second phase subsequent to the first phase, the amplifying including opening the first switch and the second switch and closing the fifth switch and the sixth switch, wherein the third switch and the fourth switch are closed during the second phase.

12. The method of claim 11, further comprising resetting the dynamic amplifier, during a third phase subsequent to the second phase, the resetting including opening the third switch, the fourth switch, the fifth switch, and the sixth switch, wherein the first switch and the second switch are open during the third phase.

13. The method of claim 11, wherein a voltage of the common-source node rises during the first phase without a change in a differential output voltage across the pair of differential output nodes due to a cross-coupling of the first switch and the second switch compared to the third switch and the fourth switch.

14. A dynamic amplifier comprising:
a pair of differential input transistors;
a pair of cross-coupled switches coupled between the pair of differential input transistors and a pair of differential output nodes for the dynamic amplifier;
a first pair of switches coupled between the pair of differential input transistors and the pair of differential output nodes; and
a second pair of switches coupled between the pair of differential input transistors and the pair of differential output nodes, wherein:
for a first phase, the pair of cross-coupled switches and the first pair of switches are configured to be closed and the second pair of switches are configured to be open; and
for a second phase subsequent to the first phase, the pair of cross-coupled switches are configured to be open and the first pair of switches and the second pair of switches are configured to be closed.

15. The dynamic amplifier of claim 14, wherein:
sources of the pair of differential input transistors are coupled together at a common-source node; and
a voltage of the common-source node is configured to rise during the first phase.

16. The dynamic amplifier of claim 15, wherein:
a cross-coupling of the pair of cross-coupled switches is configured to allow the voltage of the common-source node to rise during the first phase without a change in a differential output voltage across the pair of differential output nodes; and
amplification of a differential input signal input to the pair of differential input transistors is configured to occur during the second phase.

17. The dynamic amplifier of claim 14, wherein for a third phase subsequent to the second phase, the pair of cross-coupled switches, the first pair of switches, and the second pair of switches are configured to be open.

18. An analog-to-digital converter (ADC) comprising the dynamic amplifier of claim 14, the ADC further comprising a conversion stage configured to generate a digital output and a residue voltage, wherein the dynamic amplifier is coupled to the conversion stage and is configured to amplify the residue voltage.

19. The dynamic amplifier of claim 7, wherein:
a control input of the first switch is coupled to a control input of the second switch;
a control input of the third switch is coupled to a control input of the fourth switch; and
a control input of the fifth switch is coupled to a control input of the sixth switch.

20. The dynamic amplifier of claim 7, wherein:
the first switch and the second switch are implemented by a first pair of transistors;
the third switch and the fourth switch are implemented by a second pair of transistors; and
the first pair of transistors has a same transistor size as the second pair of transistors.

* * * * *